United States Patent
Kim et al.

(10) Patent No.: US 8,551,353 B2
(45) Date of Patent: Oct. 8, 2013

(54) HIERARCHICAL STRUCTURE AND MANUFACTURING METHOD THEREOF

(75) Inventors: Jae-Hyun Kim, Daejeon (KR); Hak-Joo Lee, Daejeon (KR); Seung-Min Hyun, Daejeon (KR); Hyun-Ju Choi, Daejeon (KR); Byung-Ik Choi, Daejeon (KR); Ki-Don Kim, Daejeon (KR); Dae-Guen Choi, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 367 days.

(21) Appl. No.: 12/995,204

(22) PCT Filed: Aug. 24, 2009

(86) PCT No.: PCT/KR2009/004702
§ 371 (c)(1),
(2), (4) Date: Nov. 30, 2010

(87) PCT Pub. No.: WO2010/021528
PCT Pub. Date: Feb. 25, 2010

(65) Prior Publication Data
US 2011/0081521 A1    Apr. 7, 2011

(30) Foreign Application Priority Data
Aug. 19, 2008    (KR) .................. 10-2008-0081026

(51) Int. Cl.
*C03C 15/00*    (2006.01)
(52) U.S. Cl.
USPC ................................ 216/36; 216/40; 216/54
(58) Field of Classification Search
USPC ............................... 216/36, 40, 54
See application file for complete search history.

(56) References Cited

U.S. PATENT DOCUMENTS

| | | | | |
|---|---|---|---|---|
| 7,755,835 | B2* | 7/2010 | Stuck et al. | 359/569 |
| 2007/0206488 | A1* | 9/2007 | Thelander et al. | 369/288 |
| 2007/0230233 | A1* | 10/2007 | Takahashi et al. | 365/145 |
| 2009/0294803 | A1* | 12/2009 | Nuzzo et al. | 257/213 |

FOREIGN PATENT DOCUMENTS

| | | |
|---|---|---|
| CN | 101100282 A | 1/2008 |
| CN | 101117730 A | 2/2008 |
| JP | 2004-314238 | 11/2004 |
| KR | 10-0814730 | 3/2008 |
| KR | 10-2010-0024049 | 3/2010 |

(Continued)

OTHER PUBLICATIONS

Fengxiang Zhang et al., "Biomimetic, hierarchical structures on polymer surfaces by sequential imprinting," Applied Surface Science 254, 2975-2979, Oct. 30, 2007.

(Continued)

*Primary Examiner* — Binh X Tran
(74) *Attorney, Agent, or Firm* — Lexyoume IP Meister, PLLC.

(57) ABSTRACT

Provided are a shape of a hierarchical structure, an engineering effect of the hierarchical structure according to the shape, an increasing method of the engineering effect, an application method of the hierarchical structure for novel material or parts, and a mass-manufacturing method of the hierarchical structure. The present invention relates to a hierarchical structure and a manufacturing method thereof, and includes a hierarchical structure in which at least one nano-object that has a characteristic length of a nanoscale region in an internal matrix is arranged in a predetermined pattern. According to the exemplary embodiments of the present invention, an excellent characteristic that is generated in a nanoscale region may be used in a structure of a macroscopic scale region, and structures that have different scales may be simply interconnected or interfaced regardless of the different scales.

12 Claims, 13 Drawing Sheets

(56) References Cited

FOREIGN PATENT DOCUMENTS

| WO | 2007-046772 | 4/2007 |
|----|-------------|--------|
| WO | 2008-102620 | 8/2008 |
| WO | 2009-075694 | 6/2009 |

OTHER PUBLICATIONS

Michael J. Birnkrant et al., "Layer-in-Layer Hierarchical Nanostructures Fabricated by Combining Holographic Polymerization and Block Copolymer Self-Assembly," Nano Letters, vol. 7, No. 10, 3128-3133, Sep. 14, 2007.

Hoon Eui Jeong, et al., Capillary-driven Rigiflex Lithography for Fabricating High Aspect-Ratio Polymer Nanostructures, The Korean Society of Visualization, vol. 5, No. 1, (2007), pp. 3-8.

* cited by examiner

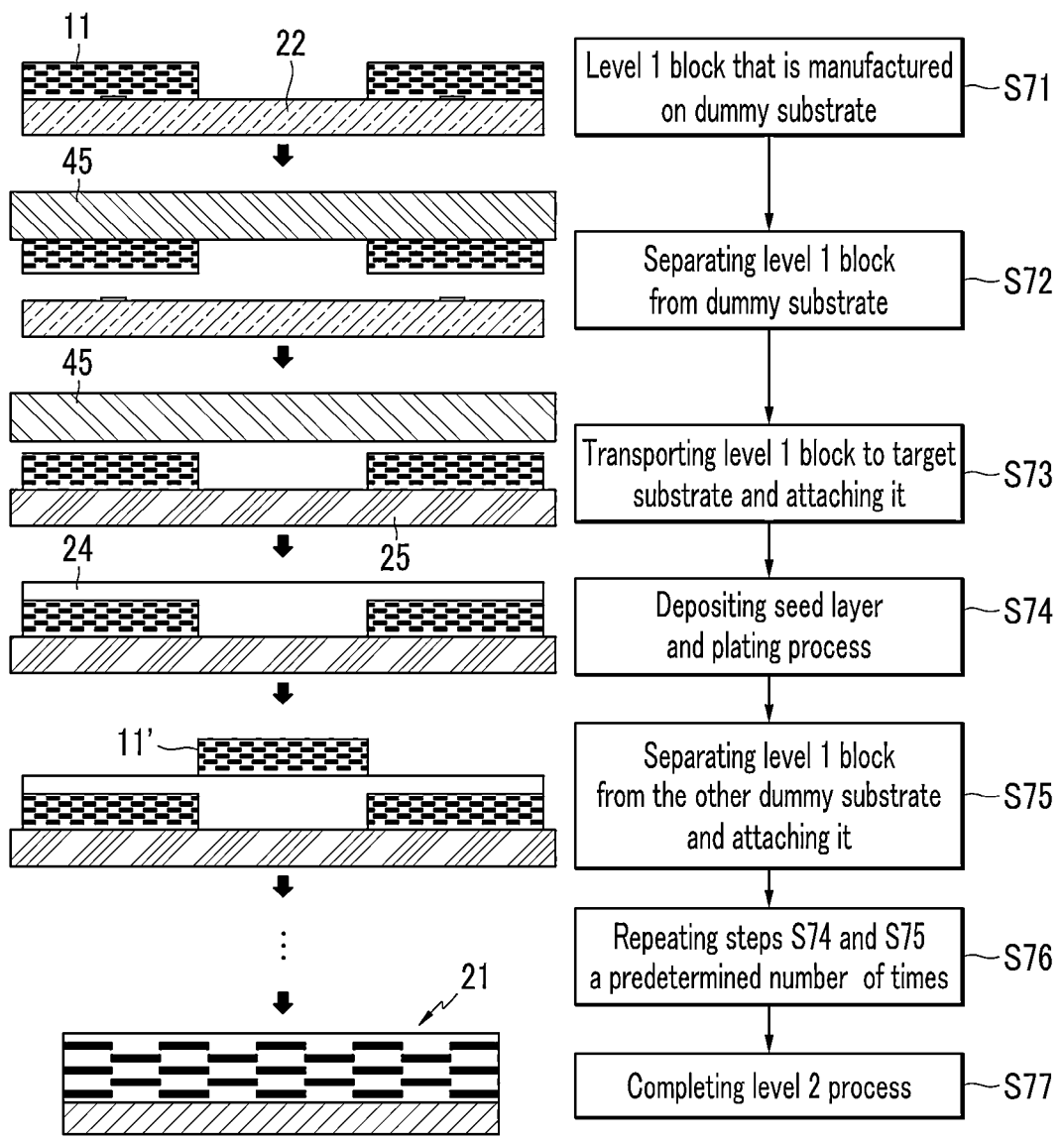

HIERARCHICAL STRUCTURE AND MANUFACTURING METHOD THEREOF

TECHNICAL FIELD

The present invention relates to a hierarchical structure and a manufacturing method thereof. More particularly, the present invention relates to a shape of a hierarchical structure, an engineering effect of the hierarchical structure according to the shape, an increasing method of the engineering effect, an application method of the hierarchical structure for novel material or parts, and a mass-manufacturing method of the hierarchical structure.

BACKGROUND ART

Since the scanning tunneling microscope was developed in 1980, nano-measurement technology for measuring a special phenomenon that is generated in a nanoscale region that has a characteristic length of 100 nm has been rapidly developed. Currently, the nano-measurement technology is actively applied to measure special mechanical, electromagnetic, optical, chemical, or thermal properties that are generated in the nanoscale region.

Through the development of the nano-measurement technology, it has been found that in the nanoscale region, a natural phenomenon that is different from a known macroscopic scale region occurs, and until now, a novel natural phenomenon has been continuously reported in the nanoscale region.

In addition, since carbon nanotubes have received attention through documents in 1991 by Lijima, nano-material technology in which various nano-materials that are configured by various metals and semiconductors, that is, nanowire, nanorods, nanobands, quantum dots, and the like are applied to real life, has been actively researched.

Meanwhile, in the current level of semiconductor process technology, in the case of a predetermined diode, a critical dimension of a semiconductor process reaches 100 nm or less. The semiconductor process technology provides a method that can more freely and inexpensively manufacture a structure of a nanoscale, and through this, an infinite possibility of the results of the nano-technology being applied to real life has come.

The above information disclosed in this Background section is only for enhancement of understanding of the background of the invention and therefore it may contain information that does not form the prior art that is already known in this country to a person of ordinary skill in the art.

DISCLOSURE

Technical Problem

The present invention has been made in an effort to provide a hierarchical structure in which an excellent characteristic that is generated in a nanoscale region may be implemented in a structure of a macroscopic scale region, and a manufacturing method thereof.

Technical Solution

An exemplary embodiment of the present invention provides a hierarchical structure wherein at least one nano-object that has a characteristic length of a nanoscale region is arranged in a first pattern on a first matrix of a first block, and at least one first block is arranged in a second pattern on a second matrix of a second block.

The first matrix or the second matrix may be formed of a polymer or a metal.

The characteristic length may be in the range of 1 nm to 100 nm.

The nano-object may be any one that is selected from a quantum dot, a nanosphere, a nanoparticle, a nanotube, a nanowire, and a line pattern of a nano-scale region.

The first pattern may be formed by any one method that is selected from optical lithography, soft lithography, holographic lithography, nanoimprint, shadow mask, and metal transfer printing methods.

The second block may be larger than the first block by 5 to 100 times.

Another exemplary embodiment of the present invention provides a hierarchical structure wherein at least one fourth block that has a characteristic length of a nanoscale region is coupled with the outside of the first structure, where at least two third blocks are coupled with each other.

The characteristic length may be in the range of 1 nm to 100 nm.

Yet another exemplary embodiment of the present invention provides a manufacturing method of a hierarchical structure, which includes: (a) forming a first matrix on a first substrate; (b) arranging at least one nano-object that has a characteristic length of a nanoscale region in a first pattern on the first matrix; (c) forming a second matrix on the first pattern of the step (b); (d) forming a first block by separating the first substrate; (e) arranging at least one first block in the second pattern on the second substrate; (f) forming a third matrix on the second pattern of the step (e); and (g) forming a second block by separating the second substrate.

The first matrix or the second matrix may be formed of a polymer or a metal.

The characteristic length may be in the range of 1 nm to 100 nm.

The nano-object may be any one that is selected from a quantum dot, a nanosphere, a nanoparticle, a nanotube, a nanowire, and a line pattern of a nanoscale region.

The pattern may be formed by any one method that is selected from optical lithography, soft lithography, holographic lithography, nanoimprint, shadow mask, and metal transfer printing methods.

The step (a) may further include (a1) forming a sacrificial layer on the first substrate before the first matrix is formed.

The step (d) may include (d1) etching a photoresist pattern or inorganic pattern on the second matrix, after forming it, and (d2) removing the photoresist pattern or inorganic pattern.

The photoresist pattern or inorganic pattern may be formed by using an optical lithography or imprint lithography method.

The step (e) may include attaching the first block on the second substrate by using a chuck.

The step (e) may further include forming an attachment enhancing layer on the second substrate before the first block is arranged.

The attachment enhancing layer may be a self-assembled monolayer or a polymer adhesive layer.

The second block may be larger than the first block by 5 to 100 times.

Still another exemplary embodiment of the present invention provides a manufacturing method of a hierarchical structure, which includes: (A) forming at least one third block that has a characteristic length of a nanoscale region and at least one fourth block that is larger than the third block; (B) attaching the fourth block on the third substrate and attaching the third block on the fourth block; and (C) separating the third substrate.

The fourth block may be larger than the third block by 5 to 100 times.

The step (B) may include attaching the fourth block or the third block on the third substrate or the fourth block by using a chuck.

The step (B) may include forming an attachment enhancing layer on the third substrate before the fourth block is attached.

The attachment enhancing layer may be a self-assembled monolayer or a polymer adhesive layer.

Advantageous Effects

According to the exemplary embodiments of the present invention, the effect may be largely classified into three factors.

First, a method in which an excellent characteristic that is generated in a nanoscale region may be applied in a structure of a macroscopic scale region is provided. Second, a method for simply interconnecting or interfacing structures that have different size scales regardless of the size scale is provided. Third, a method for simply manufacturing parts that include a three-dimensional shape that is difficult to be manufactured by a related art is provided.

DESCRIPTION OF DRAWINGS

FIG. 13 is a process view that illustrates the level 2 process in the manufacturing method of the hierarchical structure according to the third exemplary embodiment of the present invention.

MODE FOR INVENTION

Before detailed content for implementing the present invention is described, a configuration that does not directly relate to the technical gist of the present invention is omitted in the range that deranges the technical gist of the present invention.

In addition, terms or words that are used in the present specification and claims should be understood as meanings and concepts that correspond to the technical spirit of the present invention in consideration of the principle that the concept of the term can be appropriately defined in order to describe the invention by using the best method by the inventor.

A possibility for implanting an excellent characteristic that is generated in a nanoscale region in a macroscopic structure is proved through a current study for a natural structure.

Figure 1:
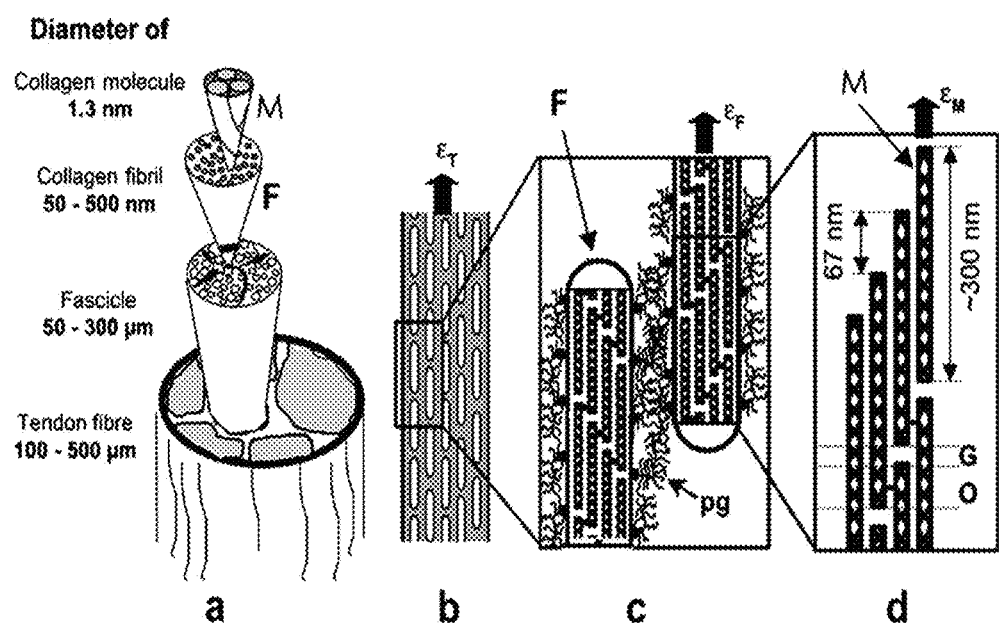
FIG. 1 is a schematic view that illustrates an example of a hierarchical structure that is found in a human tendon.

FIG. 1 is a schematic view that illustrates an example of a hierarchical structure that is found in a human tendon.

By the hierarchical structure that is shown in FIG. 1, a human tendon may show excellent strength and maintain a very large deformation ratio to stress that is applied from the outside. In addition to the human tendon, a similarly hierarchical structure is observed in an animal bone, such that the animal bone shows excellent fracture toughness.

Even though defects may be present in the human tendon or animal bone, this excellent fracture toughness occurs because the hierarchical structure weakens external impact, and this hierarchical structure, as shown in FIG. 1, has a basic structure of the nanoscale region that is continuously hierarchical until the step 6 or 7.

Figure 2:
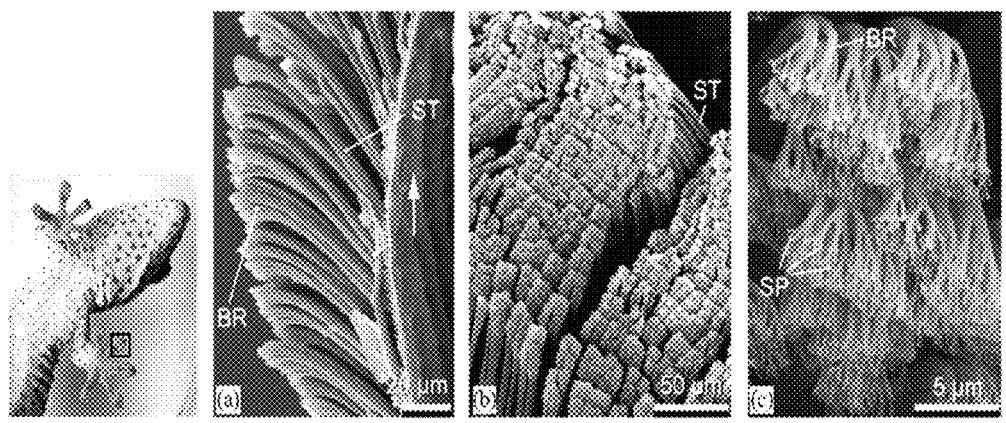
FIG. 2 is a picture that illustrates an example of a hierarchical structure that is formed on a sole of a Gecko lizard.

As another example of implementing the excellent characteristic by the hierarchical structure, an example of the hierarchical structure that is formed on the sole of the Gecko lizard is illustrated in FIG. 2.

The Gecko lizard amplifies the van der Waals force that is generated in the nanoscale region to the macroscopic scale region by using the hierarchical structure that is illustrated in FIG. 2. By this, the Gecko lizard ensures attachment ability such that it can freely move across a ceiling or glass window of a building.

The amount of the attachment ability is very small through the Van der Waals force in the nanoscale region, but the amount of the attachment ability may be geometrically increased by expanding it through the hierarchical structure to the macroscopic scale region. In this way, the attachment force that the Gecko lizard that has a weight of several hundred grams attaches itself to the ceiling or glass window occurs.

In the related art, there is no technology that artificially manufactures the hierarchical structure, but according to the exemplary embodiments of the present invention, it is possible to produce the artificial hierarchical structure that implements the excellent characteristic, that is, excellent fracture toughness or attachment ability.

In addition, the exemplary embodiments of the present invention provide a method for simply interconnecting or interfacing the structures that have different scales regardless of the scale.

According to the development of the nanotechnology, technologies for implementing transistors or various NEMS (nano-electro-mechanical systems) of the nanoscale region by using the structure of the nanoscale region, that is, the nanotube or nanowire, have been developed, but there is no technology for interconnecting or interfacing the structure of the nanoscale region with the structure of the macroscopic scale region.

According to the exemplary embodiments of the present invention, it is possible to interconnect or interface the structures of the nanoscale region with products that are used in daily life.

Figure 3:
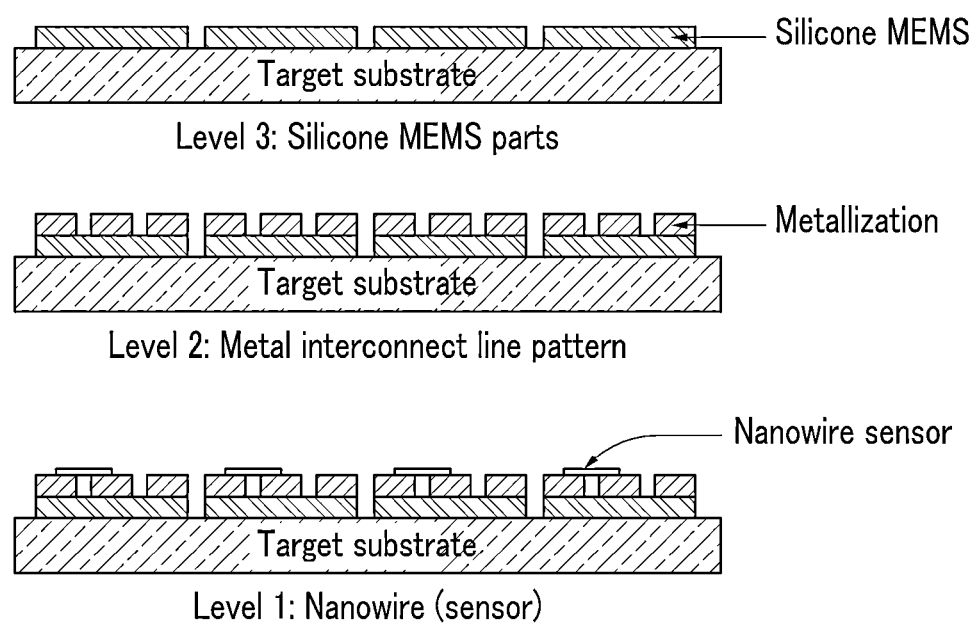
FIG. 3 is a view that illustrates a structure that can be manufactured according to an exemplary embodiment of the present invention.

For example, the structure that is illustrated in FIG. 3 may be manufactured by using the hierarchical structure according to the exemplary embodiments of the present invention. That is, in FIG. 3, it is possible to manufacture a product that is interconnected or interfaced with the silicon MEMS (micro-electro-mechanical systems) at the upper stage that corresponds to the scale region of several tens of micrometers or more, a metal interconnect line that corresponds to the scale region of several micrometers or less at the center, and a nanowire sensor at the lower stage that corresponds to the scale region of several tens of nanometers and has very high measurement sensitivity.

In FIG. 3, the material of the attachment ability increase layer for the electrical connection between the levels may be carefully selected, or the attachment ability increase layer may not be used. If the attachment ability increase layer is not used, the attachment ability may be increased by applying surface treatment technology such as plasma treatment technology. This will be described in detail below.

Meanwhile, the exemplary embodiments of the present invention provide a method for simply manufacturing parts that include a three-dimensional shape that is difficult to manufacture by a related art.

The method for manufacturing 3-dimensional products may be classified into an additive method and a subtractive method. The additive method is a method in which basic blocks are layered or assembled to manufacture 3-dimensional products, and may be exemplified by stereolithography or laser sintering. On the other hand, the subtractive method is a method in which a desired shape is implemented by stepwise cutting of a macrostructure, and may be exemplified by milling, lathing, discharging, or optical lithography.

The exemplary embodiments of the present invention present an additive manufacturing method that is different from the known additive method, and as shown in FIG. 3, it provides a method for manufacturing 3-dimensional products by layering or assembling the structures for each level. If the manufacturing method according to the exemplary embodiment of the present invention is used, a structure that cannot be manufactured by a known additive method, for example, a structure that includes a complex fluid channel therein such as a conformal cooling mold, may be manufactured, and productivity may be improved and pattern resolution may be improved by using the block of various scale regions as compared to the known additive method.

The known additive method is a method in which basic structures that have a predetermined size are layered, and as the size of the basic structure is increased, the manufacturing speed is increased in proportion to the volume of the basic structure, that is, the cube of the size of the basic structure. On the other hand, in the case of when the basic blocks for levels that are layered according to the exemplary embodiment of the present invention are layered, with respect to a portion where there is no fine pattern change, the structure is manufactured by using a basic block that has a large scale, and with respect to a portion where there is fine pattern change, the manufacturing speed may be largely improved by using a basic block that has a small scale.

In addition, most of the known additive methods include a post-treatment (polishing or finishing processing) process because the surface resolution is poor, but according to the exemplary embodiments of the present invention, the processing resolution of the structure may be improved by lowering the size of the basic block of the minimum scale region such that the post-treatment process may be minimized or omitted.

Hereinafter, the hierarchical structure and manufacturing method thereof according to various exemplary embodiments of the present invention will be described in detail with reference to the accompanying drawings.

Figure 4:
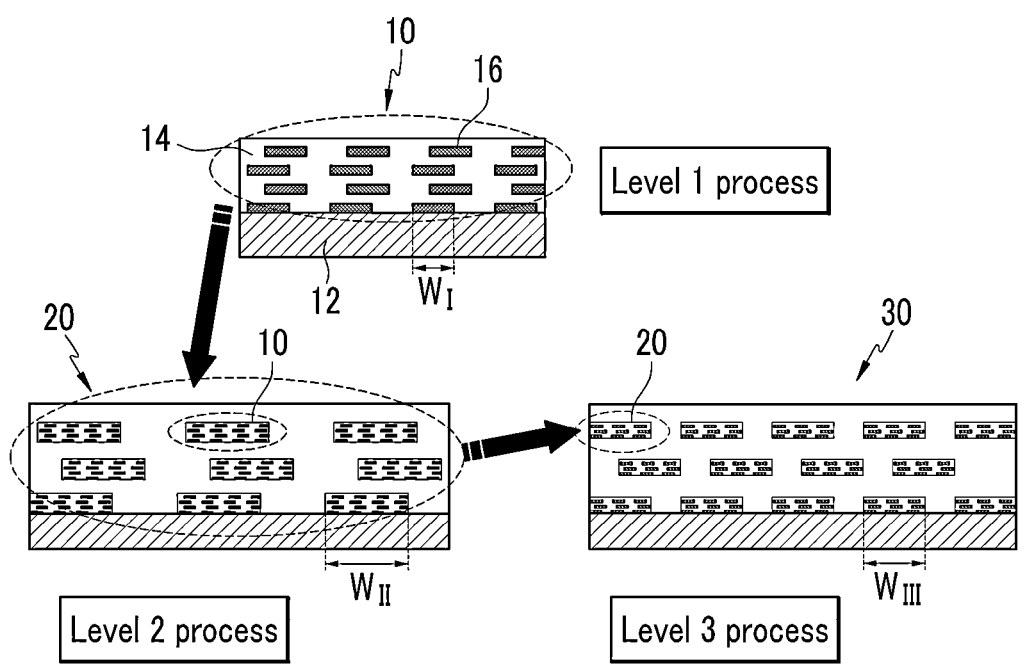
FIG. 4 is a schematic view that illustrates a manufacturing process of a hierarchical structure according to the first exemplary embodiment of the present invention.

FIG. 4 is a schematic view that illustrates a manufacturing process of a hierarchical structure according to the first exemplary embodiment of the present invention.

Referring to FIG. 4, in the level 1 process, a nano-object 16 that has a characteristic length (e.g., $W_I$) of the nanoscale region in conjunction with a matrix 14 on a substrate 12 is shown.

Figure 5:
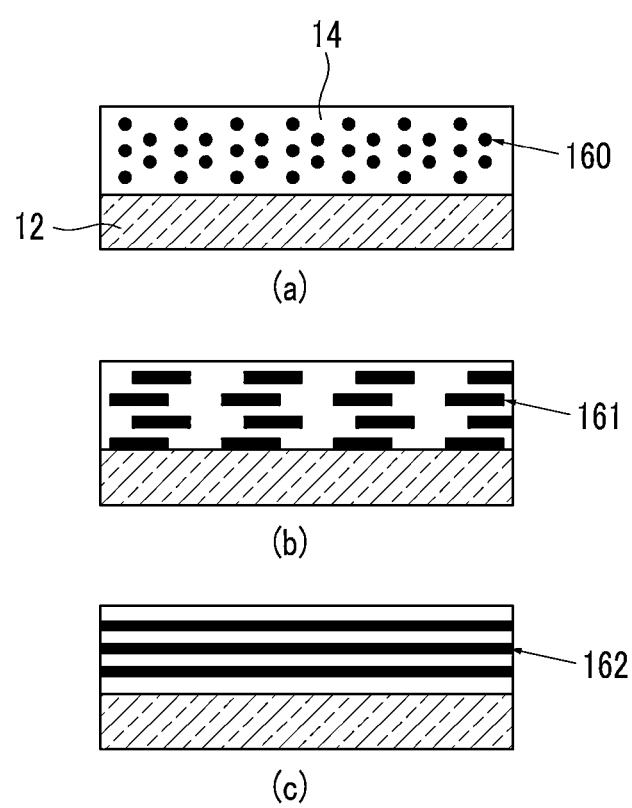
FIG. 5 is a schematic view that illustrates various examples of a nano-object that is arranged in a matrix of a level 1 process of FIG. 4.

Referring to (a) of FIG. 5, as a nano-object 160, there are a quantum dot, a nanosphere, or a nanoparticle. Referring to (b) of FIG. 5, as a nano-object 161, there are a nanotube, a nanowire, or a line pattern of a nanoscale region. Referring to (c) of FIG. 5, a nano-object 162 is a nano-object that has a meaningful thickness in the nanoscale region.

The method for arranging the nano-objects 16, 160, 161, and 162 may be classified into a method in which the nano-objects 16, 160, 161, and 162 are dispersed in the matrix 14 while random distribution is ensured, and a method in which the nano-objects 16, 160, 161, and 162 have a periodic pattern in 3-dimensional space or are previously distributed at predetermined positions. In order to disperse the nano-objects so that they have a predetermined distribution, a general method, that is, a method for manufacturing a composite material on the basis of nanoparticles, and a method in which they are arranged so that they have the periodic pattern or previously distributed at predetermined positions, will be described in detail below.

Referring to FIG. 4, in a level 2 process, a level 2 block 20 is implemented by arranging a level 1 block 10 of a nanoscale region that is formed so as to have a predetermined shape and size in the 3-dimensional space. In a level 3 process, a level 3 block 30 is implemented by arranging the level 2 block 20 that has a predetermined shape and size in the 3-dimensional space. If necessary, a level 4 block, a level 5 block, and the like may be implemented stepwise by using the same method.

The scale region $W_{III}$ of the level 2 block 20 is much larger than the scale region $W_{II}$ of the level 1 block 10, and the scale region $W_{III}$ of the level 2 block 20 may be larger than the scale region $W_{II}$ of the level 1 block 10 by 5 to 100 times. This is the same as between the level 3 block 30 and the level 2 block 20, and accordingly, as the level is increased, the size of the block per level is gradually increased, such that the structure of the macroscopic scale region is finally configured.

Figure 6:
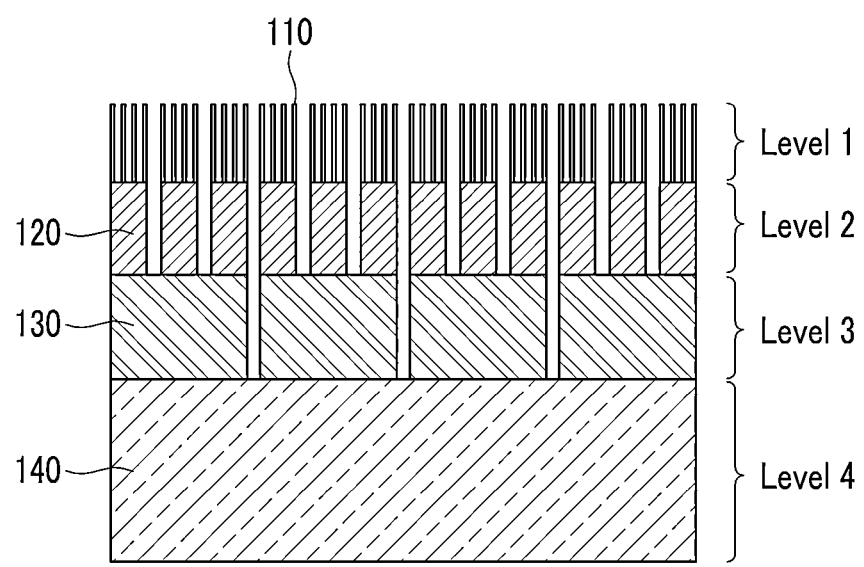
FIG. 6 is a schematic view that illustrates a hierarchical structure according to a second exemplary embodiment of the present invention.

FIG. 6 is a schematic view that illustrates a hierarchical structure according to a second exemplary embodiment of the present invention.

The hierarchical structure according to the second exemplary embodiment of the present invention, as shown in FIG. 6, may be manufactured by using the method in which the block that has the level of the largest scale (level 4 in FIG. 6) is first assembled, and the block that has the level of a smaller scale is assembled. In FIG. 6, it can be seen that the level 4 is configured by one level 4 block 140, level 3 is configured by four level 3 blocks 130, level 2 is configured by 12 level 2 blocks 120, and level 1 is configured by 48 level 1 blocks 110. The present invention is not limited to a specific number.

In the level 1 of FIG. 6, like FIG. 4, various nano-objects that are illustrated in FIG. 5 may be arranged in the matrix of each level 1 block 110. The process for manufacturing the hierarchical structure that is illustrated in FIG. 6 will be described in detail below.

Hereinafter, a method for manufacturing a hierarchical structure according to the first exemplary embodiment of the present invention that is illustrated in FIG. 4 will be described. For convenience, the nano-object 16 is the metal nanopattern and the matrix 14 is a polymer, but the present invention is not limited thereto. As an example thereof, as the matrix 14, the polymer and metal may be used, and in FIG. 11 to FIG. 13, the manufacturing process of the hierarchical structure by using the matrix and a dissimilar metal of different kinds as the nano-object material is illustrated.

Figure 7:
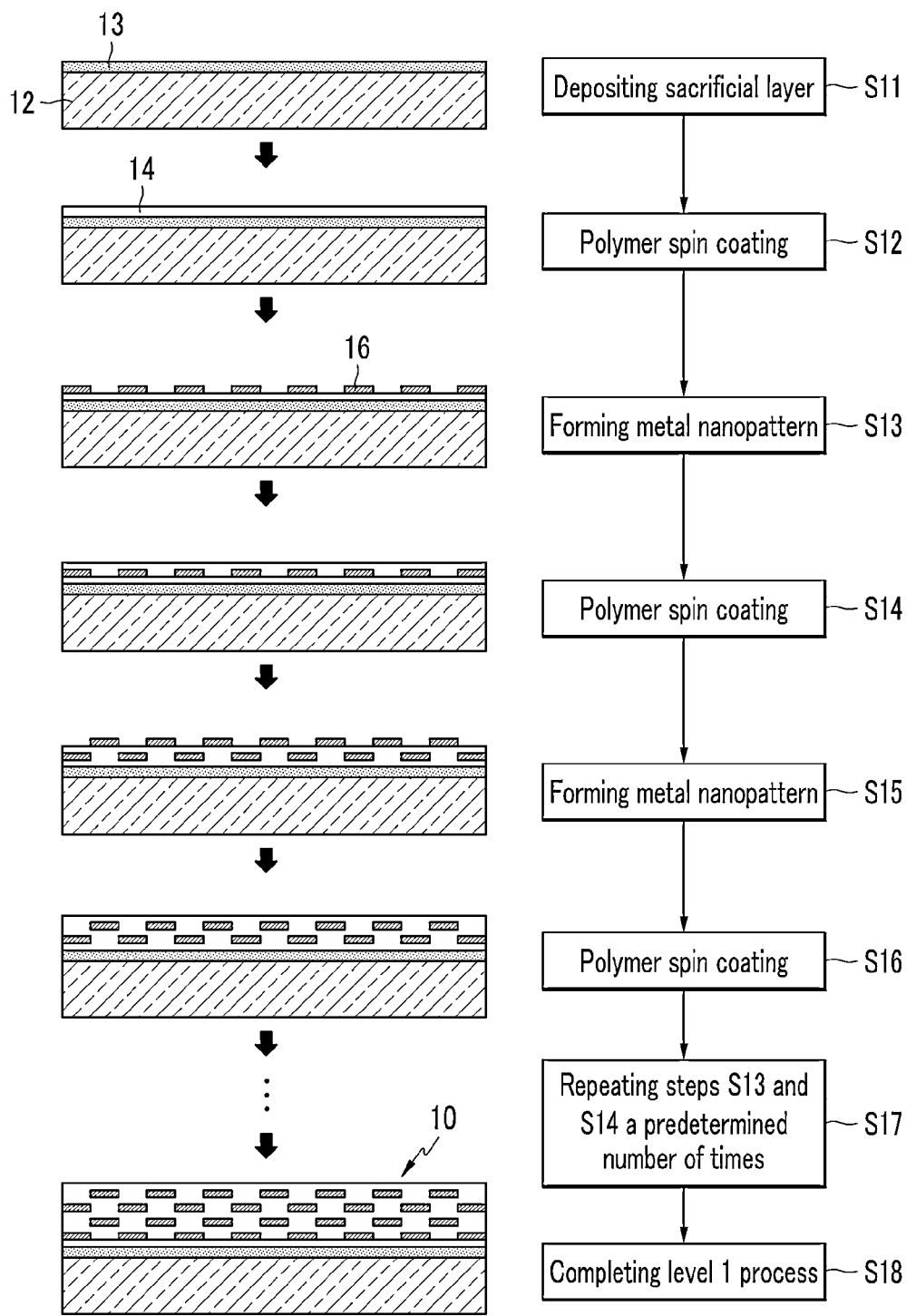
FIG. 7 is a process view that illustrates the level 1 process in the manufacturing method of the hierarchical structure according to the first exemplary embodiment of the present invention.

FIG. 7 is a process view that illustrates the level 1 process in the manufacturing method of the hierarchical structure according to the first exemplary embodiment of the present invention.

First, a sacrificial layer 13 is deposited on the substrate 12 (S11). The function of the sacrificial layer 13 of the step S11 is to allow the completed level 1 block 10 to be smoothly separated from the substrate 12 by subsequent etching. The material of the sacrificial layer 13 may be a material that has greater etching selectivity than that of the polymer that is the matrix 14.

Next, the polymer is spin coated as the matrix 14 on the sacrificial layer 13 (S12). Any polymer that can be spin coated may be used as the polymer of the matrix 14 of the step S12, and in general, the thickness may be precisely controlled according to the spin coating conditions.

Next, the metal nanopattern that is the nano-object 16 is formed on the polymer matrix 14 (S13). In the step S13, the metal nanopattern that is the nano-object 16 may be formed by using a general method. For example, a method using optical lithography, a method using nanoimprint or soft lithography, a shadow mask method, or a metal transfer printing method may be used.

In addition, if the holographic lithography method is used, without the layering process of the metal nanopattern that is the nano-object 16, it is possible to easily perform the level 1 process, and nano-objects 16 that have various shapes may be 3-dimensionally or periodically arranged. However, in this case, the size of the minimum structure, that is, the size of the level 1 block 10, should be 100 nm or more, and there is a limit of the material that may be used.

Next, the polymer matrix 14 is spin coated so as to cover the formed nano-object 16 (S14), the metal nanopattern is formed thereon (S15), and the polymer matrix 14 is formed by the spin coating so as to cover the formed metal nanopattern (S16).

In order to form a desired number of nano-object 16 layers, step S13 and step S14 may be repeated (S17), thereby completing the level 1 process (S18).

Figure 11:
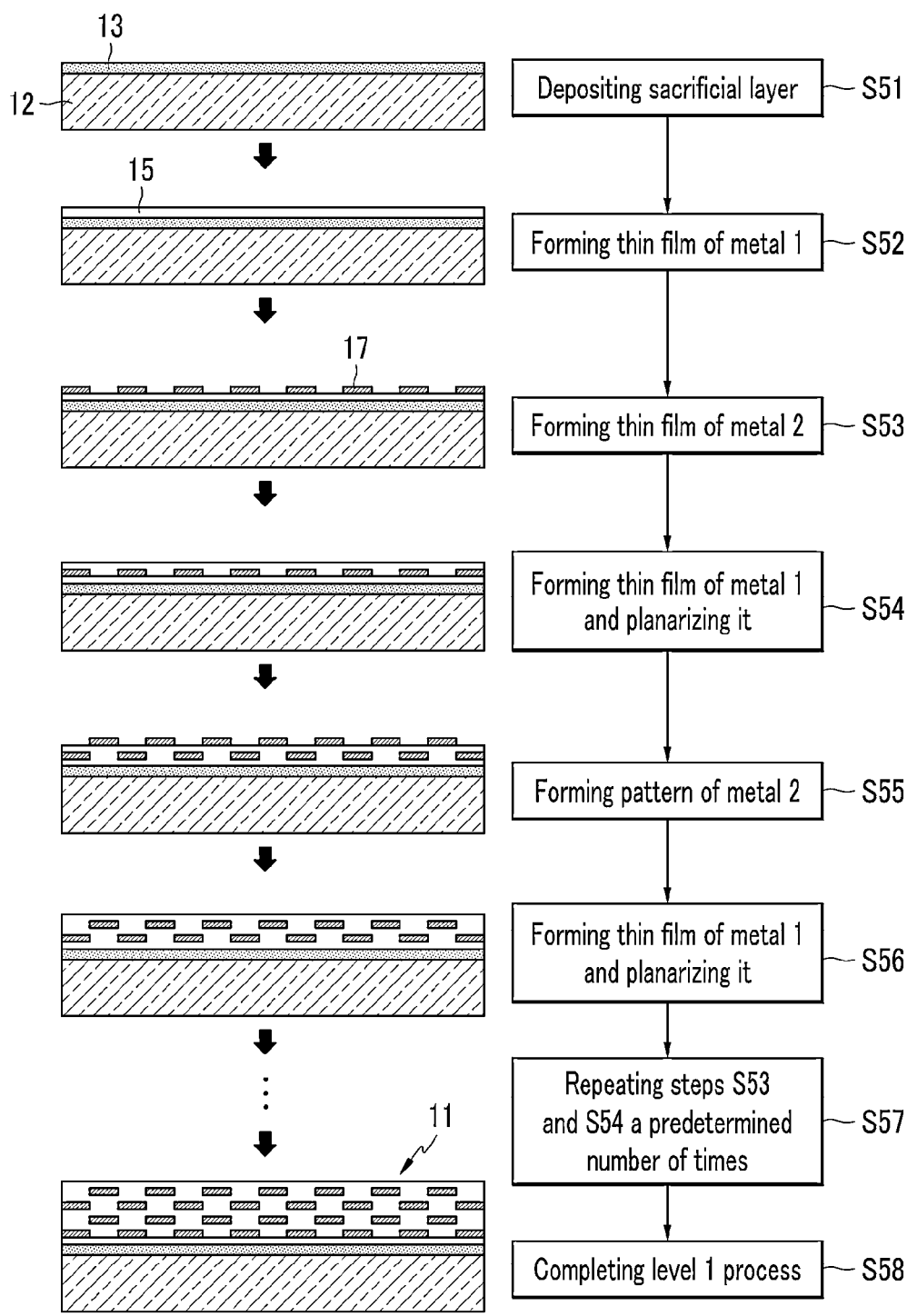
FIG. 11 is a process view that illustrates the level 1 process in the manufacturing method of the hierarchical structure according to the third exemplary embodiment of the present invention.

Meanwhile, FIG. 11 is a process view that illustrates the level 1 process in the manufacturing method of the hierarchical structure according to the third exemplary embodiment of the present invention.

In FIG. 11, the case of when a dissimilar metal is used instead of the polymer as the matrix 15 of the level 1 block 11 is illustrated, but it is entirely similar to the process illustrated in FIG. 7 except that the matrix 15 is a dissimilar metal with the nano-object 17.

Figure 8:
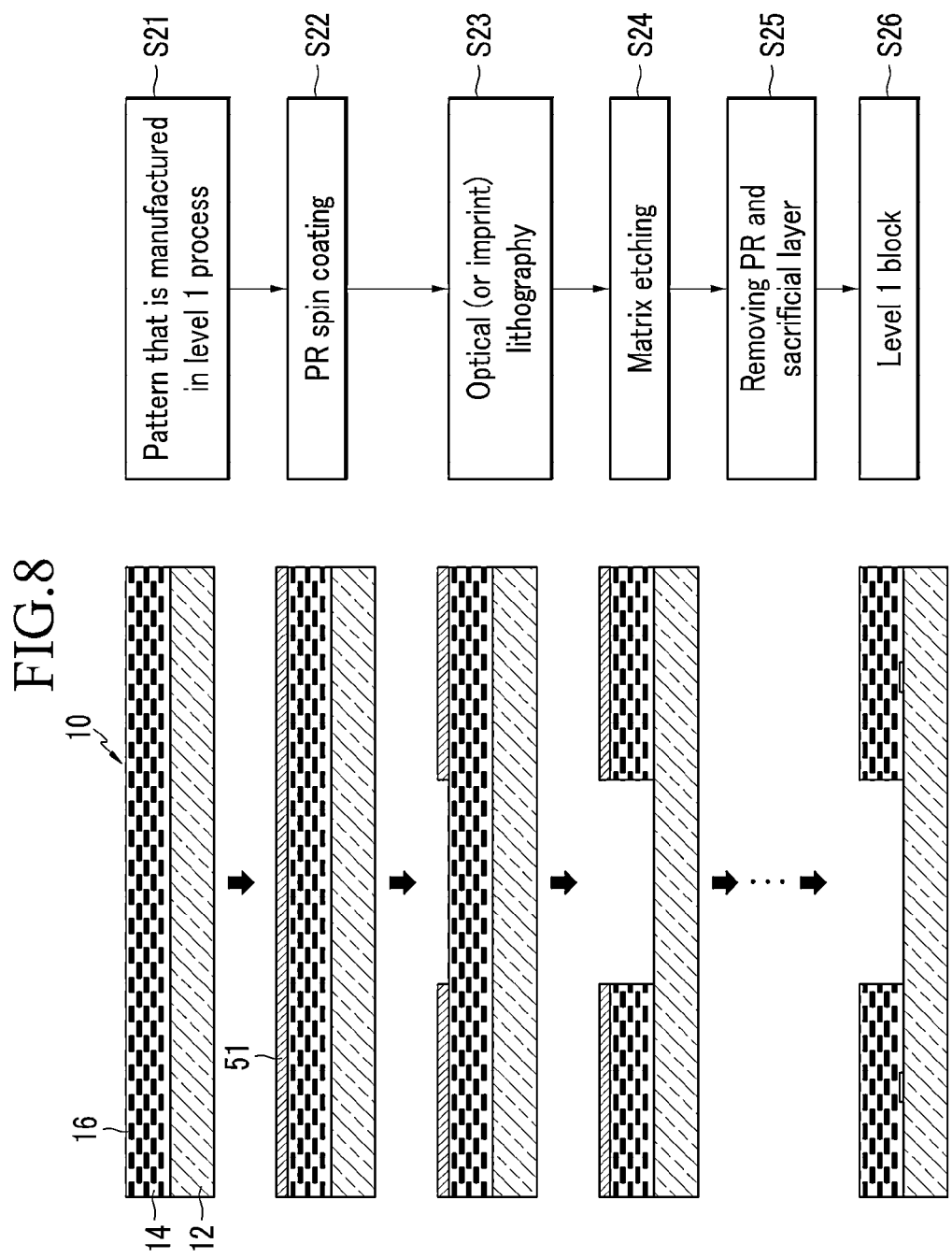
FIG. 8 is a process view that illustrates the process for manufacturing the level 1 block after the level 1 process in the manufacturing method of the hierarchical structure according to the first exemplary embodiment of the present invention.

FIG. 8 is a process view that illustrates the process for manufacturing the level 1 block after the level 1 process in the manufacturing method of the hierarchical structure according to the first exemplary embodiment of the present invention.

Referring to FIG. 8, first, the pattern that is manufactured in the level 1 process is prepared (S21), photoresist (PR) 51 coating is performed over the pattern (S22), and the lithography process is performed (S23). The lithography of the step S23 may be general optical lithography or imprint lithography.

Next, the polymer matrix 14 is etched by using the photoresist 51 pattern that is formed by the step S23 (S24), and according to the kind of polymer matrix 14, it may be etched by forming the inorganic pattern instead of the photoresist 51 pattern as the etch mask. In the case of when the inorganic pattern is used as the etch mask instead of the photoresist 51 pattern, an inorganic layer deposition process using a metal (W, Ti, etc.) or an oxide ($SiO_2$, etc.) is required instead of the photoresist 51 spin coating of the step S22, and the pattern is formed on the inorganic layer by the lithography of the step S23.

Additionally, the step S23 may include processes such as layer deposition, patterning, or etching. Since these additional processes may be easily understood by those who are skilled in the art that relates to the manufacturing of the semiconductor, the detailed description thereof is omitted.

Finally, if the photoresist 51 pattern or inorganic pattern and sacrificial layer 13 are removed (S25), the level 1 block 10 is obtained (S26).

The material of the sacrificial layer 13 between the level 1 block 10 and the substrate 12 may be the same as or different from the photoresist 51 or inorganic layer of the step S22. In the case of the same material, since the photoresist 51 and sacrificial layer 13 may be removed by using one process, the etching process is simple compared to the case of the different material.

Figure 12:
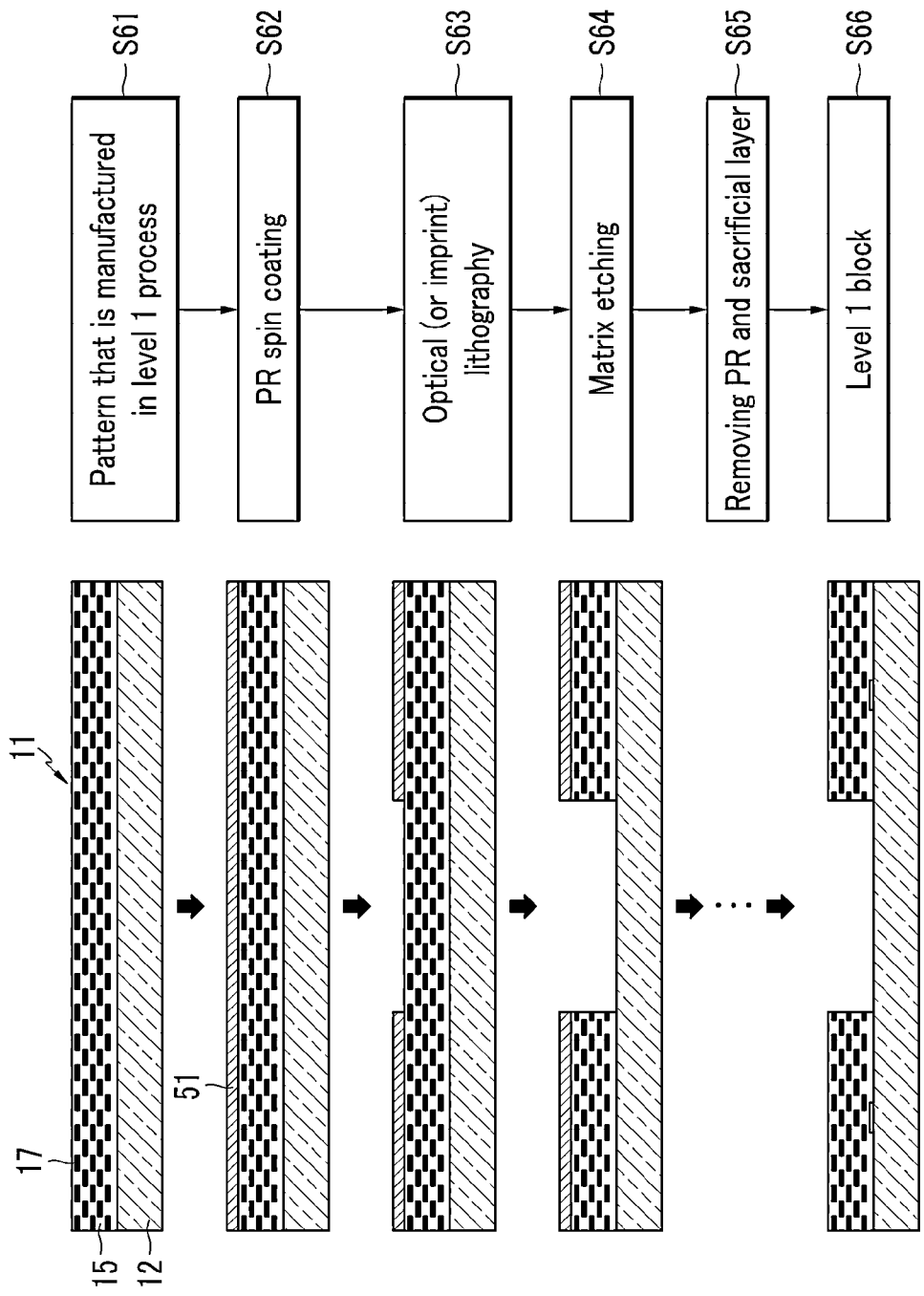
FIG. 12 is a process view that illustrates a process for manufacturing a level 1 block after the level 1 process in the manufacturing method of the hierarchical structure according to the third exemplary embodiment of the present invention.

Meanwhile, FIG. 12 is a process view that illustrates a process for manufacturing a level 1 block after the level 1 process in the manufacturing method of the hierarchical structure according to the third exemplary embodiment of the present invention.

In FIG. 12, the case of when dissimilar metal is used instead of the polymer as the matrix 15 of the level 1 block 11 is shown, but it is entirely similar to the process illustrated in FIG. 8 except that the matrix 15 is a dissimilar metal with the nano-object 17.

Figure 9:
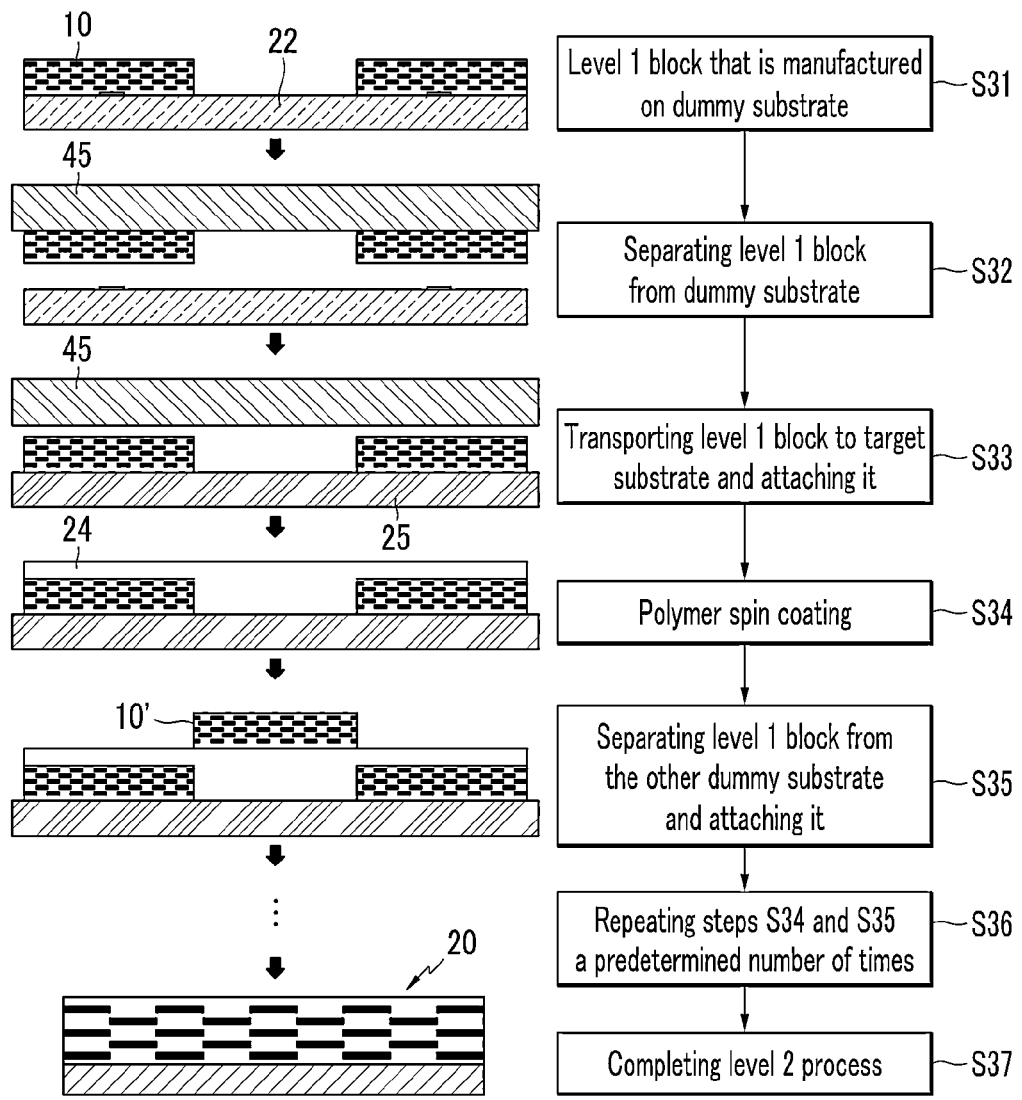
FIG. 9 is a process view that illustrates the level 2 process in the manufacturing method of the hierarchical structure according to the first exemplary embodiment of the present invention.

FIG. 9 is a process view that illustrates the level 2 process in the manufacturing method of the hierarchical structure according to the first exemplary embodiment of the present invention.

Referring to FIG. 9, first, a level 1 block 10 is prepared on a dummy substrate 22 (S31), and the level 1 block 10 is removed in one piece by using a chuck 45 (S32). As the chuck 45, an electrostatic chuck or a polymer chuck that is generally used in a semiconductor-related process may be used.

Since the oxide layer between the level 1 block 10 and the dummy substrate 22 is already etched, the attachment ability between the level 1 block 10 and the dummy substrate 22 is very low. Therefore, it is possible to relatively easily remove the level 1 block 10 by using the chuck 45.

Next, the removed level 1 block 10 is transported to a target substrate 32 (S33).

In this case, the attachment ability between the chuck 45 and level 1 block 10 may be actively controlled. That is, when the level 1 block 10 is separated from the dummy substrate 22, the attachment ability between the chuck 45 and the level 1 block 10 should be increased, and when the level 1 block 10 is transported to the target substrate 32, the attachment ability between the chuck 45 and level 1 block 10 may be reduced.

In the case of when the electrostatic chuck is used, it is possible to control the attachment ability by controlling a voltage that is applied to the chuck 45, and in the case of when the polymer chuck is used, it is possible to control the attachment ability by controlling a modification speed of the chuck 45.

If it is difficult to attach the level 1 block 10 on the target substrate 32 by using only the attachment ability of the chuck 45, the attachment enhancing layer may be formed on the target substrate 32 before the step S33. As the attachment enhancing layer, a self-assembled monolayer such as gycidoxypropyl trimethoxy silane (GPT), acryloxypropyl methyl dichloro silane (APMDS), or aminopropyl triethoxy silane (APTS), and the polymer adhesive layer that has a thickness of the nanoscale region may be used.

Next, the polymer layer 24 is spin coated so as to cover the level 1 block 10 (S34), and the other level 1 block 10' is attached on the polymer layer 24 (S35). The step S35 may be performed by using the chuck 45 like the step S33. If necessary, the step S34 and the step S35 may be repeated several times (S36), thereby completing the level 2 process (S37).

After the level 2 process, the process for manufacturing the level 2 block 20 is similar to the manufacturing process of the level 1 block 10 that is illustrated in FIG. 8. However, as compared to the level 1 block 10, they are different from each other in that the size of the level 2 block 20 is very large. The level 3 process using the manufactured level 2 block 20 is similar to the level 2 process that is illustrated in FIG. 9.

FIG. 13 is a process view that illustrates the level 2 process in the manufacturing method of the hierarchical structure according to the third exemplary embodiment of the present invention.

In FIG. 13, the case of when dissimilar metal is used instead of the polymer as the matrix 25 of the level 1 block 11 is illustrated, but it is entirely similar to the process illustrated in FIG. 9 except that the matrix 25 is a dissimilar metal.

Figure 10:
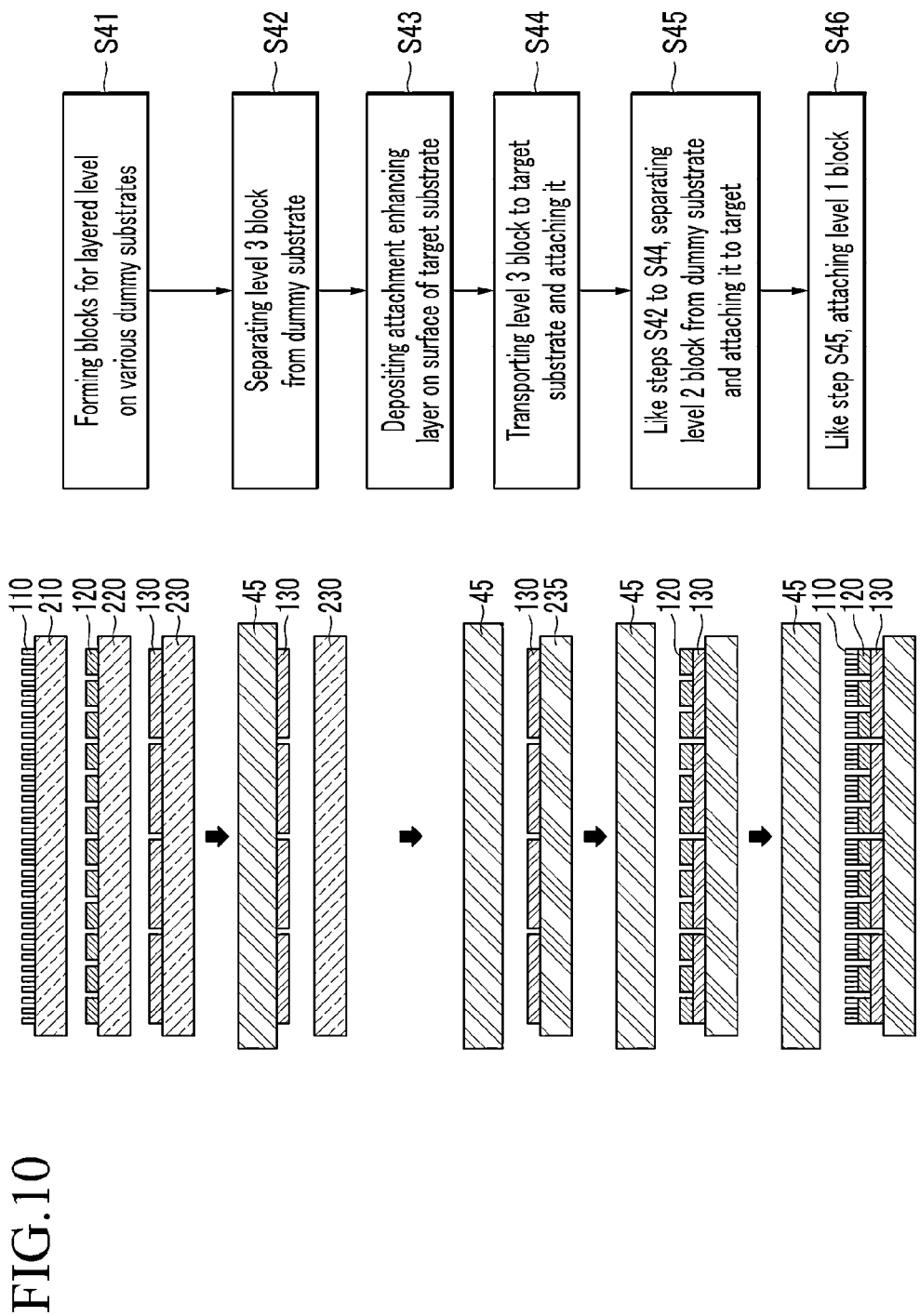
FIG. 10 is a process view that illustrates the manufacturing process of the hierarchical structure according to the second exemplary embodiment of the present invention.

FIG. 10 is a process view that illustrates the manufacturing process of the hierarchical structure according to the second exemplary embodiment of the present invention. Referring to FIG. 10, a method for manufacturing a hierarchical structure according to the second exemplary embodiment of the present invention that is illustrated in FIG. 6 is described.

As described above, in the process for manufacturing the hierarchical structure according to the first embodiment that is illustrated in FIG. 4, it is sequentially manufactured from the block that has the small scale to the block that has the large scale, but the manufacturing method of the hierarchical structure according to the second exemplary embodiment is different therefrom in that the block that has the large scale is first formed on the target substrate and the blocks that have the smaller scale are formed sequentially on the large block. In addition, in the manufacturing method of the hierarchical structure according to the first exemplary embodiment, after the block that has the small scale is manufactured, the larger block is sequentially manufactured, but in the manufacturing method of the hierarchical structure according to the second exemplary embodiment that is illustrated in FIG. 6, the order of manufacturing between the basic blocks for each layer is not limited.

In order to manufacture the hierarchical structure according to the second exemplary embodiment that is illustrated in FIG. 6, first, basic blocks 110, 120, and 130 for each layer are formed on each of dummy substrates 210, 220, and 230 (S41). In this case, since the basic blocks 110, 120, and 130 for each layer do not depend on the manufacturing process, the basic blocks 110, 120, and 130 for each layer may be manufactured individually. On the other hand, in the manufacturing process of the hierarchical structure according to the first exemplary embodiment, since the basic block for each layer is manufactured by using the basic block of the previous process, in order to manufacture each basic block for each layer, the process should be sequentially performed.

In the present exemplary embodiment, in the manufacturing of the basic blocks 110, 120, and 130 for each layer, the above optical or imprint lithography technology may be used, and a shadow mask method or metal transfer printing method may be applied.

Next, among the basic blocks 110, 120, and 130 that are manufactured for each layer, the largest block (block 130) is separated from the dummy substrate 230 (S42). The chuck 45 that is used in the step S42 is the same as the case of FIG. 9.

In order to attach the block that is separated from the dummy substrate 210, 220, and 230 on the target substrate 235, the attachment enhancing layer may be deposited (S43). Likewise, before the step S33 of FIG. 9, the deposited attachment enhancing layers may be used.

Thereafter, the block 130 that is attached to the chuck 45 is attached on the target substrate 235 by contacting it with the target substrate 235 on which the attachment enhancing layer is deposited (S44).

Then, like the step S42 to step S44, the smaller blocks 110 and 120 are transported to the target substrate 235 and attached (S45 and S46). If necessary, the step for layering the blocks that have the same level may be repeated several times.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A manufacturing method of a hierarchical structure, the method comprising:
    (a) forming a first matrix on a first substrate;
    (b) arranging at least one nano-object that has a characteristic length of a nanoscale region in a first pattern on the first matrix;
    (c) forming a second matrix on the first pattern of the step (b);
    (d) forming a first block by separating the first substrate;
    (e) arranging at least one first block in a second pattern on a second substrate;
    (f) forming a third matrix on the second pattern of the step (e); and
    (g) forming a second block by separating the second substrate.

2. The method of claim 1, wherein
the first matrix or the second matrix is a polymer or a metal.

3. The method of claim 1, wherein
the characteristic length is in the range of 1 nm to 100 nm.

4. The method of claim 1, wherein
the nano-object is any one that is selected from a quantum dot, a nanosphere, a nanoparticle, a nanotube, a nanowire and a line pattern of a nanoscale region.

5. The method of claim 1, wherein
the first pattern is formed by any one method that is selected from optical lithography, soft lithography, holographic lithography, nanoimprint, shadow mask, and metal transfer printing methods.

6. The method of claim 1, wherein
the step (a) further comprises
    (a1) before the first matrix is formed, forming a sacrificial layer on the first substrate.

7. The method of claim 1, wherein
the step (e) includes
attaching the first block on the second substrate by using a chuck.
8. The method of claim 1, wherein
the second block is larger than the first block by 5 to 100 times in length.
9. The method of claim 1, wherein
the step (d) includes
(d1) after forming a photoresist pattern or inorganic pattern on the second matrix, etching the second matrix; and
(d2) removing the photoresist pattern or inorganic pattern.
10. The method of claim 9, wherein
the photoresist pattern or inorganic pattern is formed by using an optical lithography or imprint lithography method.
11. The method of claim 1, wherein
the step (e) further includes
before the first block is arranged, forming an attachment enhancing layer on the second substrate.
12. The method of claim 11, wherein
the attachment enhancing layer is a self-assembled monolayer or a polymer adhesive layer.

* * * * *